(12) United States Patent
Watkins

(10) Patent No.: US 11,394,354 B2
(45) Date of Patent: Jul. 19, 2022

(54) DIGITAL POWER AMPLIFIER AND METHOD OF OPTIMISING A DIGITAL POWER AMPLIFIER

(71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 86 days.

(21) Appl. No.: 16/914,748

(22) Filed: Jun. 29, 2020

(65) Prior Publication Data

US 2021/0408981 A1    Dec. 30, 2021

(51) Int. Cl.
    *H03F 3/21*     (2006.01)
    *H03F 1/02*     (2006.01)
    *H03F 1/32*     (2006.01)

(52) U.S. Cl.
    CPC ........... *H03F 3/211* (2013.01); *H03F 1/0205* (2013.01); *H03F 1/32* (2013.01); *H03F 2200/451* (2013.01)

(58) Field of Classification Search
    CPC .......... H03F 3/211; H03F 1/0205; H03F 1/32; H03F 2200/451
    USPC ....................................................... 330/295
    See application file for complete search history.

(56) References Cited

U.S. PATENT DOCUMENTS

| 10,547,279 | B2 | 1/2020 | Watkins |
| 2014/0049318 | A1* | 2/2014 | Goswami ............. H03F 1/0294 330/253 |
| 2017/0237407 | A1 | 8/2017 | Babaie et al. |
| 2017/0324381 | A1 | 11/2017 | Qian et al. |

FOREIGN PATENT DOCUMENTS

| TW | 201637356 A | 10/2016 |
| WO | WO 2018/132006 A1 | 7/2018 |

OTHER PUBLICATIONS

Gaber et al. "A CMOS IQ Digital Doherty Transmitter Using Modulated Tuning Capacitors", Proceedings of the IEEE European Conference on Solid-State Circuits (ESSCIRC), Sep. 2012, pp. 341-344. (Year: 2012).*
Huang et al., "Peak to Average Power Reduction for Low-Power OFDM Systems", , published in IEEE Communications Society, ICC 2007 proceedings (Year: 2007).*
Viswanathan, V., Efficiency Enhancement of Base Station Power Amplifiers Using Doherty Technique, MSc. Thesis, Virginia Polytechnic Institute and State University, Feb. 3, 2004, Blacksburg, Virginia (Year: 2004).*
U.S. Appl. No. 16/176,684, filed Oct. 31, 2018, Watkins.

(Continued)

*Primary Examiner* — Hafizur Rahman
(74) *Attorney, Agent, or Firm* — Oblon, McClelland, Maier & Neustadt, L.L.P.

(57) ABSTRACT

A digital power amplifier for a signal, the digital power amplifier comprising:
a first activatable amplifier;
a second activatable amplifier; and
an output network,
wherein an output of the first amplifier and an output of the second amplifier are coupled to the output network, and
wherein the amplifiers and/or the output network are configured such that four output levels are obtainable at an output of the output network, and said output levels are configured to optimise a linearity of the digital power amplifier for said signal.

19 Claims, 11 Drawing Sheets

(56) References Cited

OTHER PUBLICATIONS

U.S. Appl. No. 16/658,767, filed Oct. 21, 2019, Watkins.
Li et al., "A Wideband Efficiency-Enhanced Class-G Digital Power Amplifier for IoT Applications", IEEE Microwave and Wireless Components Letters, vol. 28, No. 8, 2018, pp. 714-716.
Hashemi et al., "An Intrinsically Linear Wideband Digital Polar PA featuring AM-AM and AM-PM Corrections Through Nonlinear Sizing, Overdrive-Voltage Control, and Multiphase RF Clocking", IEEE Journal of Solid-State Circuits, vol. 52, No. 12, 2017, 3 pages.
Yoo et al., "A Power-Combined Switched-Capacitor Power Amplifier in 90nm CMOS", IEEE Radio Frequency Integrated Circuits Symposium, 2011, pp. 1-4.

\* cited by examiner

DIGITAL POWER AMPLIFIER AND METHOD OF OPTIMISING A DIGITAL POWER AMPLIFIER

FIELD

Embodiments described herein relate generally to digital power amplifiers and methods of optimising said digital power amplifiers.

BACKGROUND

Contemporary communications, broadcast and wireless standards like LTE, DVB/ISDB and 802.11ax, are based on orthogonal frequency division multiplexing (OFDM) modulation. Although OFDM is very spectrally efficient, it does so at the expense of a high peak-to-average power ratio (PAPR), which for the RF power amplifier (PA) in a transmitter equates to low average efficiency. It is likely that future, fifth generation (5G) standards will have an even greater PAPR, leading to even lower average operating efficiency.

Conventional single device RF PAs (i.e. class A, B, C, E, F and J) are capable of high efficiency only in their saturation region, i.e. peak output power ($P_{OUT}$). As $P_{OUT}$ is reduced, efficiency degrades. In a known device, the input power may be reduced to the amplifiers to accommodate the peaks without clipping them and causing distortion. This is referred to as "backing-off". Contemporary communications, broadcast and wireless connectivity standards require that on average, a PA operates at significant back-off to accommodate the large signal peaks. These peaks can often be 10 dB larger than the average $P_{OUT}$.

There is a continuing need to improve such amplifiers and methods of optimising such amplifiers. In particular, there is a need to provide amplifiers that have improved linearity. There is also a need to provide amplifiers that have improved efficiency.

Arrangements of the present invention will be understood and appreciated more fully from the following detailed description, made by way of example only and taken in conjunction with drawings in which.

DETAILED DESCRIPTION

Figure 1:
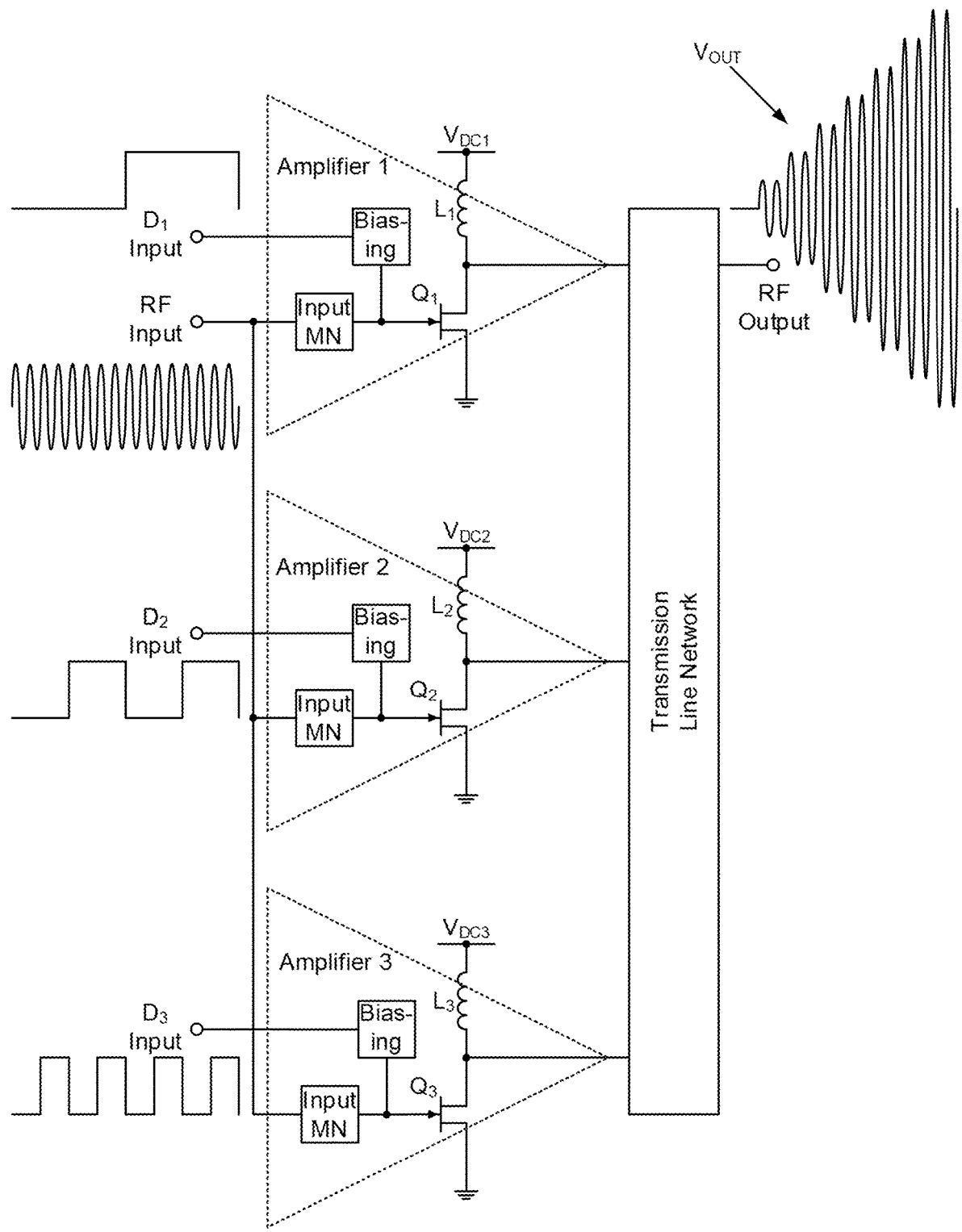
FIG. 1 shows a Digital Power Amplifier (DPA) with a transmission line network.

According to a first aspect, there is provided a digital power amplifier for a signal, the digital power amplifier comprising:
a first activatable amplifier;
a second activatable amplifier; and
an output network,
wherein an output of the first amplifier and an output of the second amplifier are coupled to the output network, and
wherein the amplifiers and/or the output network are configured such that four output levels are obtainable at an output of the output network, and said output levels are configured to optimise a linearity of the digital power amplifier for said signal.

According to an embodiment, the output network comprises one or more transmission lines.

In an embodiment the output network comprises a rat-race combiner.

In an embodiment the output network comprises a hybrid coupler.

In an embodiment the digital amplifier is operable at different efficiencies at each output level.

In an embodiment, the efficiencies at each output level are determined from a probability density function of the signal.

In an embodiment, the efficiencies at each output level are determined using a genetic algorithm.

In an embodiment, the first and second amplifiers are operable in their saturation regions.

In an embodiment, wherein the first and second amplifiers are operable at different saturation powers.

In an embodiment, the first and second amplifiers each comprises a transistor device.

In an embodiment, the digital power amplifier is configured to receive digital signals for individually activating and deactivating the first or second amplifiers, said signals individually applied as gate bias to the transistors of the amplifiers.

In an embodiment, the digital signals for individually activating the amplifiers are configured to have voltage amplitudes at least equal to threshold voltages of the transistors of the amplifiers.

In an embodiment, the digital signals for individually deactivating the amplifiers are configured to be below a threshold voltage of the transistors.

According to a second aspect, there is provided a method of optimising a digital power amplifier for a signal, wherein the digital power amplifier comprises a first activatable amplifier, a second activatable amplifier, and an output network, wherein an output of the first amplifier and an output of the second amplifier are coupled to the output network, and wherein the amplifiers and/or the output network are configured such that four output levels are obtainable at an output of the output network, the method comprising:
    determining output levels configured to optimise a linearity of the digital power amplifier for said signal; and
    configuring the amplifiers and/or the output network so that the determined output levels are obtainable.

In an embodiment determining output levels optimised for the signal comprises:

Initialising the output levels; and adjusting the output levels to improve a linearity metric.

In an embodiment, each output level is iteratively adjusted in turn.

In an embodiment, the output levels comprises setting the output levels so that they are equally spaced.

In an embodiment adjusting the output levels to reduce a linearity metric for each amplifier comprises incrementing or decrementing the output levels by a predetermined offset value.

In an embodiment, adjusting the output levels comprises adjusting each output level in turn.

In an embodiment, the linearity metric comprises an Adjacent Channel Power Ratio (ACPR) and/or an Error Vector Magnitude (EVM).

In an embodiment, the output levels are adjusted until the linearity metric for each amplifier is less than a predetermined value.

In an embodiment, the output levels are adjusted for a predetermined number of iterations.

In an embodiment, the determining of the output levels comprises using a trained algorithm.

In an embodiment, the method of optimising a digital power amplifier for a signal comprises:

assigning an efficiency target to each determined output level based on a probability density function of the signal, and configuring the amplifiers and/or the output network such that the digital power amplifier is operable at the assigned efficiency targets, wherein the efficiency target for an output level is the operation efficiency of the digital power amplifier for said output level.

According to a third aspect, there is provided a device comprising the digital power amplifier according to the first aspect, wherein the device is a mobile phone basestation or a DVB transmitter.

A number of architectures are known to increase power amplifier efficiency including: Doherty, Outphasing, Envelope Tracking (ET) and Dynamic Load Modulations (DLM). However these architectures have a high level of complexity and appear to have an efficiency cap when operating at back-off (i.e. below a power amplifiers saturation region). The efficiency cap may be approximately 65% when amplifying high PAPR signals.

In addition to the techniques described above, Digital Power Amplifiers (DPA) can also be used to achieve a highly efficient power amplifier. In DPA the gain and the phase of the output RF modulated signal are controlled by digital means. Where DPAs are employed in a transmitter, the DPA operates as the Digital to Analogue Converter (DAC). This is often referred to as a Radio Frequency Digital to Analogue Converter, or RFDAC.

FIG. 1 shows a known digital power amplifier DPA. Amplifiers 1, 2 and 3 are provided with digital data input D0, D2, D3, respectively, and a RF Input at the Radio Frequency Carrier Frequency at their inputs. The output of each amplifier is coupled to the Transmission Line Network. The Transmission Line Network is also referred to as an output network.

Each amplifier comprises an active device (e.g. Q1, Q2, Q3). In this example each active device is a Field Effect Transistor (FET) device; however, a bipolar transistor or other form of active device may be used instead. Each active device (Q1, Q2, Q3) has a gate that is driven by the RF signal and a biasing network. Optionally the gate is connected to the output of an input matching network (Input MN) for impedance matching of the input RF signal.

Figure 11:
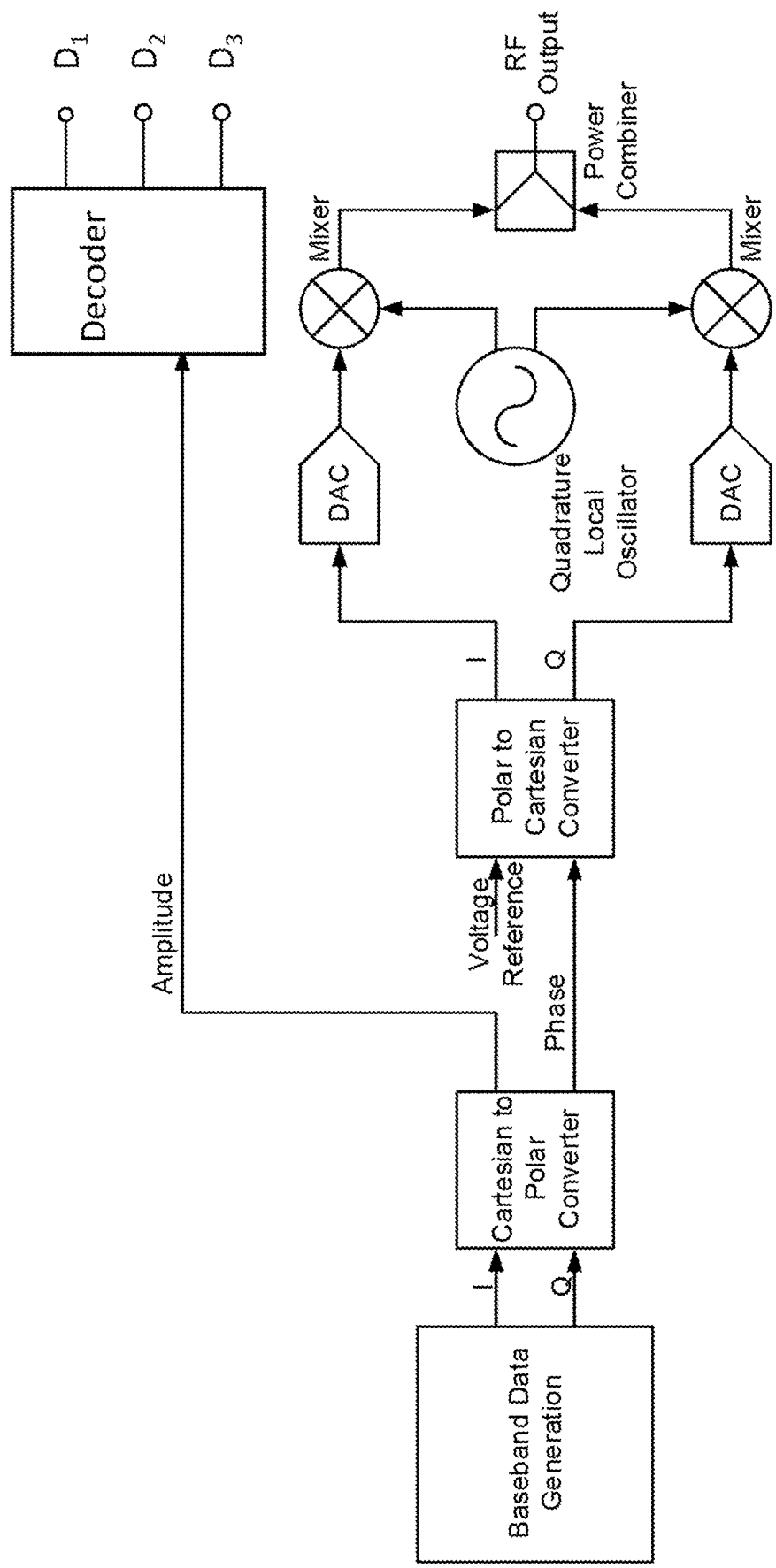
FIG. 11 shows an example of a schematic for generating the digital input signals for use in embodiments.

The biasing networks of each amplifier are connected to respective input nodes through which they receive input respective input signals $D_1$, $D_2$ and $D_3$. $D_1$, $D_2$ and $D_3$ are derived from the input data as shown in FIG. 11. Baseband data in I and Q cartesian format is converted to polar (amplitude and phase). The amplitude information is decoded to provide the signals $D_1$, $D_2$ and $D_3$. The phase only signal is converted back to I and Q with a fixed amplitude to be converted to analogue signals with Digital-to-Analogue Converters (DAC). These are then upconverted to RF by mixers, a quadrature local oscillator and power combiner.

The input signals $D_1$, $D_2$ and $D_3$ are switching signals that turn Amplifiers 1, 2 and 3 on respectively when the signal is high and that turn Amplifiers 1, 2 and 3 off respectively when the signal is low. The switching signals activate the amplifiers. The biasing networks are configured to convert the respective input digital signals ($D_1$, $D_2$ and $D_3$) into a signal of appropriate voltage for switching the active devices (Q1, Q2, Q3) on and off. The amplifiers are all driven by the same RF input signal. This will generally have a fixed amplitude, but contain the phase modulation. A power splitter will be used to pass the RF input signal to each amplifier. This can be a splitter with equal ratio splitting or asymmetric with an unequal ratio as required to ensure that all amplifiers operate in saturation, depending on the gain of the individual amplifiers. Each amplifier is enabled and disabled by controlling its gate bias. Applying a voltage just above the transistor devices threshold will enable it for amplifying an RF signal applied to its input. Applying a voltage substantially below the threshold of the transistor will turn the transistor hard-off.

In Amplifier 1, a first DC signal $V_{DC1}$ is supplied to a first inductor $L_1$, which in turn is connected to the drain of the active device $Q_1$. The first inductor $L_1$ is a high value inductor, or RF choke, which has high impedance at the RF operating frequency. The source of the active device is connected to ground.

In the present case, an N-channel FET is used. Accordingly, when a low voltage is applied to the gate of Q1, the conductivity of the FET drops thereby increasing the voltage at the drain. Conversely, when a high voltage is applied to the gate, the conductivity of the FET increases, lowering the drain voltage towards ground. The active device therefore amplifies the input signal by controlling the proportion of the supply voltage that is output at the drain.

Amplifiers 2 and 3 are configured in a similar manner, with a respective input signals $D_2$ and $D_3$, biasing networks, input matching networks, gates $Q_2$ and $Q_3$ and first inductors $L_2$ and $L_3$, respectively. The three amplifiers are configured to have different peak output powers. To provide improved efficiency across a wide range of input powers, Amplifiers 1, 2 and 3 are tuned for different power ratings.

The outputs of each amplifier are coupled to the output network. The output network presents an impedance to each amplifier. The output network affects the output of each amplifier.

Additionally and optionally, the amplifiers operate in saturation. As a result, the voltage at the output of the Digital Power Amplifier will be constant for each amplifier, regardless of the impedance presented to that amplifier by the output transmission line network. As shown in Table 1 below, there are seven distinct output states, representing an amplified version of the seven distinct input states shown by the sequence of waveforms on inputs $D_1$ to $D_3$. These 7 distinct output states represent output levels. The output levels may refer to a set of particular $P_{OUT}$s or a set of $V_{OUT}$s. As shown in Table 1, a uniform step size of 1V is assigned to each state. Each state is separated from an adjacent one by a 1V step. Since the output voltage of each amplifier is the same when the amplifier is enabled or 'ON' due to the input provided on its respective port D, the only way to vary the output power is to vary the impedance presented to each transistor.

TABLE 1

| State | Amplifier 1 | Amplifier 2 | Amplifier 3 | $P_{OUT}$ (dBm) | $V_{OUT}$ ($V_{rms}$) |
|---|---|---|---|---|---|
| 0 | off | off | off | N/A | N/A |
| 1 | off | off | on | 13.0 | 1 |
| 2 | off | on | off | 19.0 | 2 |
| 3 | off | on | on | 22.6 | 3 |
| 4 | on | off | off | 25.1 | 4 |
| 5 | on | off | on | 27.0 | 5 |
| 6 | on | on | off | 28.6 | 6 |
| 7 | on | on | on | 29.9 | 7 |

Figure 10:
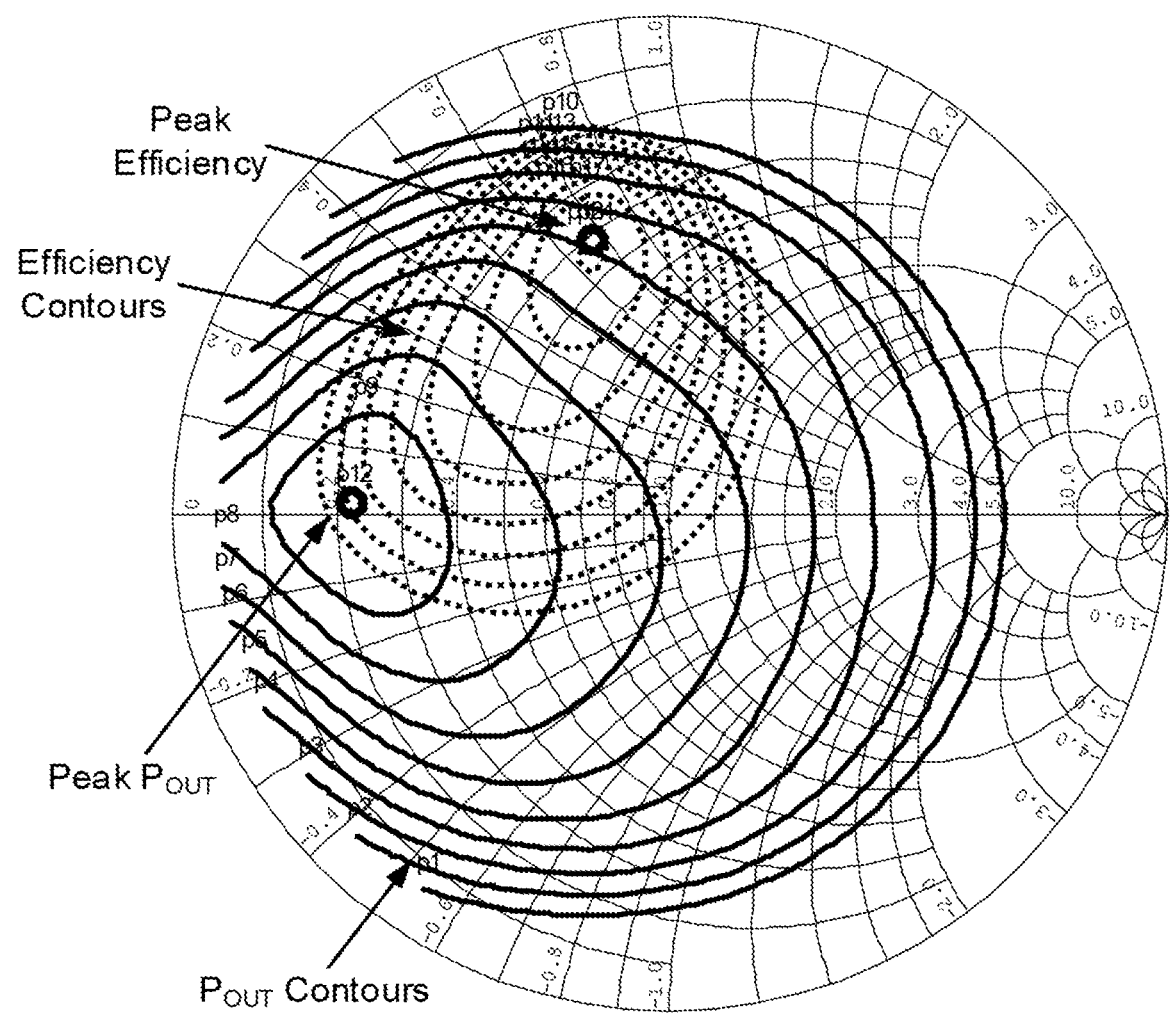
FIG. 10 shows an example of load-pull characteristics of an ATF50189 GaAs FET transistor at 1.4 GHz.

Optimum operating impedances "seen" by each amplifier are determined from the load pull data in order to achieve maximum efficiency at the required output level Pout. Example load-pull data is shown in FIG. 10 for an ATF50189 transistor at 1.4 GHz. Since each amplifier is configured to operate at a different power levels, (for example, referring to table 1, for state 1, Amplifier 3 is on and the DPA is configured to output 13 dBm; for state 2, Amplifier 2 is on and the DPA is configured to output 19 dBm; for state 4, Amplifier 1 is on and the DPA is configured to output 25.1 dBm), the impedances presented to them by the transmission line network will be different.

As will be explained further below, the output network may comprise transmission lines. During the design process, optimisation algorithms are used to determine the dimensions of all of the transmission line sections used in the output network, based on the required $P_{OUT}$ for the plurality of output states (e.g. only Amplifier 1 ON; Amplifier 1 ON, Amplifier 2 ON, Amplifier 3 OFF; Amplifier 1 ON, Amplifier 2 OFF, Amplifier 3 ON; etc.) and an efficiency target. The efficiency refers to the efficiency of the whole DPA at each state. When an individual amplifier is off, it consumes no DC power, so will have no impact on the efficiency of the overall digital power amplifier. Therefore, each state may have different efficiencies since the different individual amplifiers may be on or off. The efficiency is calculated by dividing the RF output of the DPA (by measuring with a RF power meter) by the DC power consumption measured at the power supply. An efficiency target refers to a value for efficiency that is sought for a particular output state. This process is described in U.S. Non-Provisional patent application Ser. No. 16/176,684, which is incorporated herein by reference.

When multiple amplifiers drive a load, the impedance as seen by each amplifier will change, thereby changing the output currents. This is referred to as load modulation, which occurs whenever more than one amplifier is in operation. To account for this, the RF combining network provides the correct transformation such that the appropriate impedance is presented to the output of each amplifier to obtain a set of particular $P_{OUT}$s. An example of the process used to provide an appropriate impedance is described in U.S. Non-Provisional patent application Ser. No. 16/176,684 which is incorporated herein by reference. The set of particular $P_{OUT}$s could for example follow the 6 dB steps size of a conventional DAC.

Figure 2:
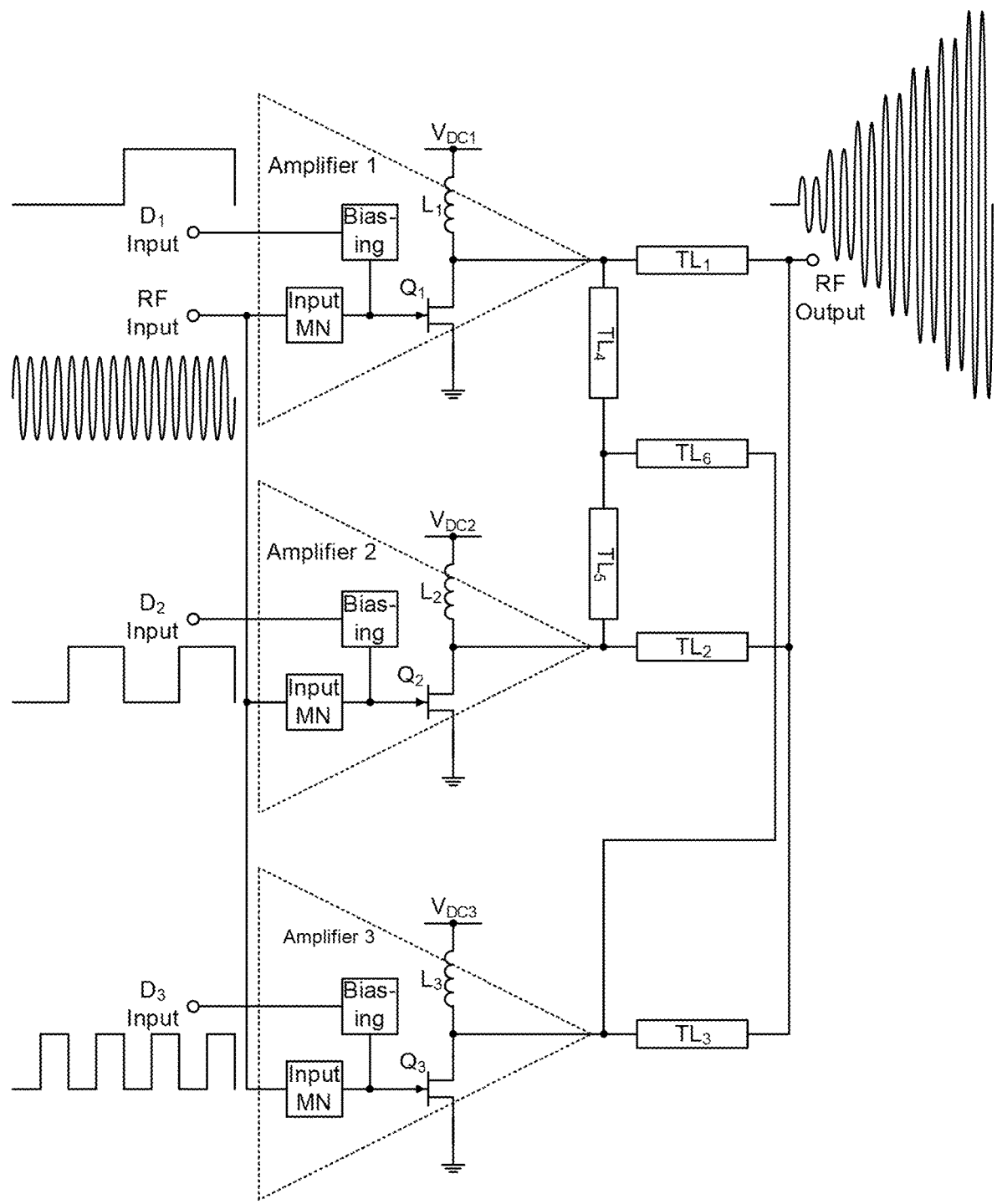
FIG. 2 shows a DPA with a rat-race combiner.

FIG. 2 shows an example of a DPA similar to that of FIG. 1 except that the output network comprises a rat-race combiner. The rat-race combiner is described in U.S. Non-Provisional patent application Ser. No. 16/176,684 which is incorporated herein by reference.

Figure 3:
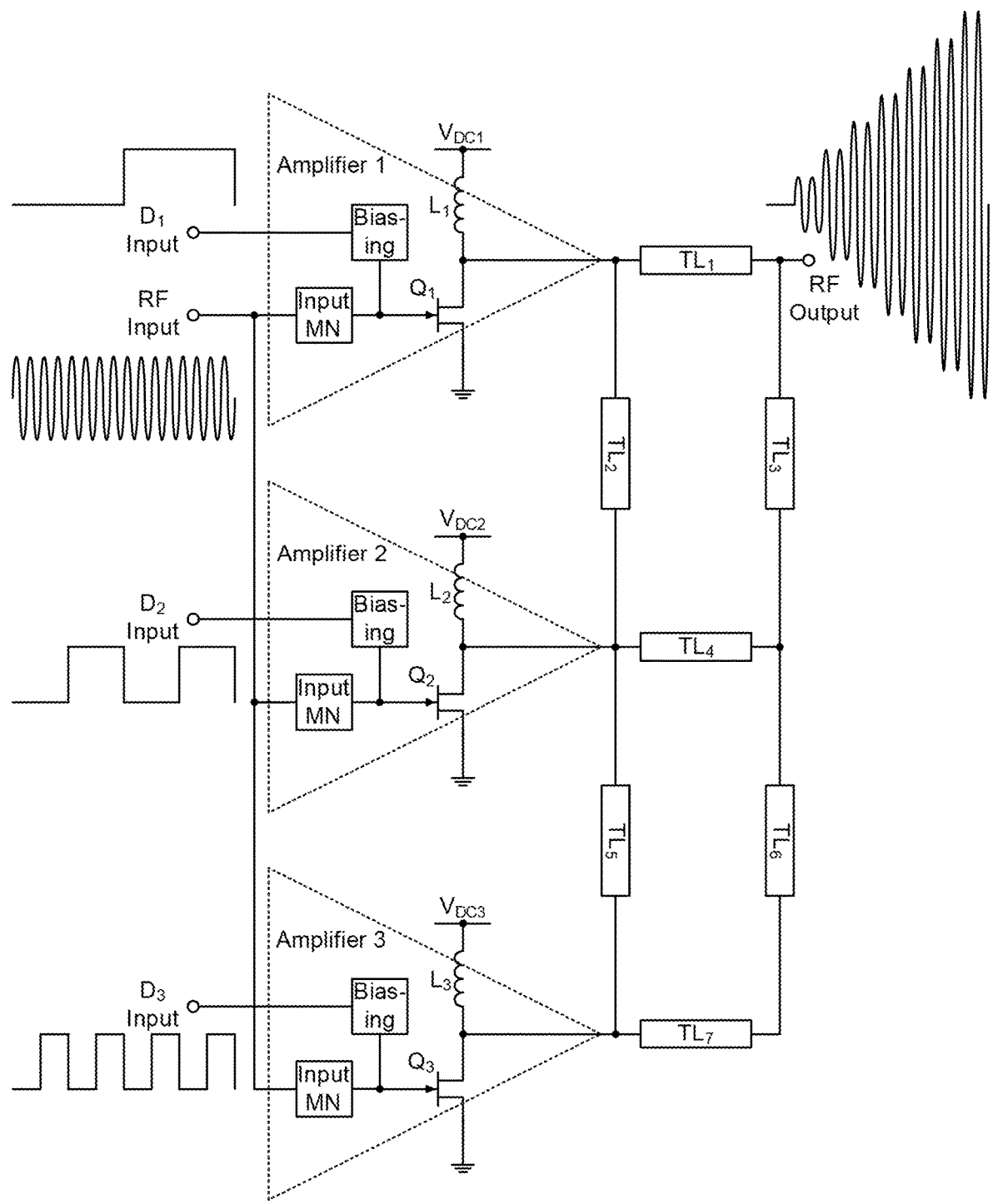
FIG. 3 shows a Digital Power Amplifier (DPA) with a hybrid combiner.

FIG. 3 shows an example of a DPA similar to that of FIG. 1 except that the output network comprises a hybrid combiner. The hybrid combiner is described in U.S. Non-Provisional patent application Ser. No. 16/658,767 which is incorporated herein by reference.

The DPAs of FIG. 2 and FIG. 3 each comprise three amplifiers that can be activated in sequence to achieve $2^3$ output states. Optionally, these amplifiers operate in a switching mode, for example in class D or E.

More generally, the DPAs shown in FIGS. 1, 2 and 3 may comprise N amplifiers and may achieve $2^N$ output states.

As described so far, the transmission line network has been used to determine the $P_{OUT}$ steps. In an embodiment this is expanded by selecting different physically sized devices, or different supply voltages ($V_{DC}$) for each amplifier.

By different physically sized amplifiers, it is meant that the components of the amplifiers are different. For example, some of the transistor devices may be different. The transistor devices are selected according to the $P_{OUT}$ of the particular amplifier. For example, as shown in Table 1, an amplifier may operate over a range of output powers and hence the transistor devices are chosen according to their rated operating powers.

Alternatively or additionally, the inductors L used in each amplifier have different values of inductance. By using different inductor values, the voltages at the drain of the FETs are different. The use of different inductor values provides an additional degree of freedom for tuning of the DPA to output $P_{out}$ output levels.

When an amplifier 1 operates in saturation, the voltage at its output (at the drain terminal of the FET) has a maximum swing of VMax_swing. VMax_swing is dependent on the supply voltage $V_{DC1}$. The higher $V_{DC1}$ is, the higher VMax_swing is, and conversely, the lower $V_{DC1}$, the lower VMax_swing. Amplifier 2 and 3 operate in a similar manner. By using different supply voltages $V_{DC1}$, $V_{DC2}$, $V_{DC3}$, the voltages at the drain of the FETs are different. The use of different supply voltages $V_{DC1}$, $V_{DC2}$, $V_{DC3}$ provides an additional degree of freedom for tuning of the DPA to output $P_{out}$ output levels.

In embodiments herein, the transmission line network, and/or the physical size of the devices, and/or the supply voltages of the amplifiers are tuneable to set the $P_{out}$ steps. Additionally and optionally, the amplifiers operate at different saturation powers. The saturation powers are related to the VMax_swing as described above.

Figure 4A:
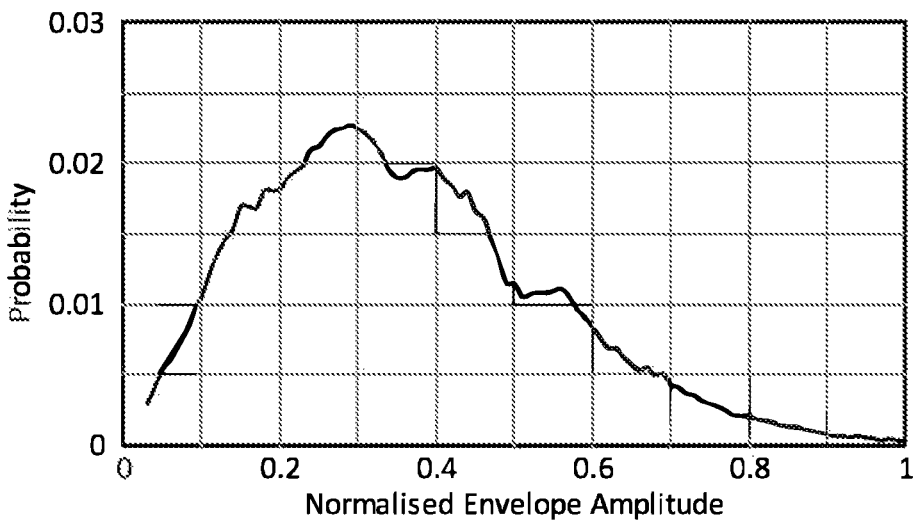
FIG. 4A shows a probability density function (PDF) of a transmitted signal.

FIG. 4A shows the probability distribution function (PDF) LTE signal with a 10.5 dB PAPR. The signal shown is a typical Orthogonal frequency-division multiple access (OFDMA) LTE signal. This is the signal that is transmitted by the DPA; this is the signal that appears at the output of the RF output of the DPA shown in FIG. 1, 2, or 3. The horizontal axis shows a normalised envelope amplitude of the signal. The relative envelope amplitude represents the relative output levels that are required to transmit the signal. The vertical axis shows a probability. The curve of the PDF represents how frequently (probability) the output levels appear in the transmitted signal.

Figure 4B:
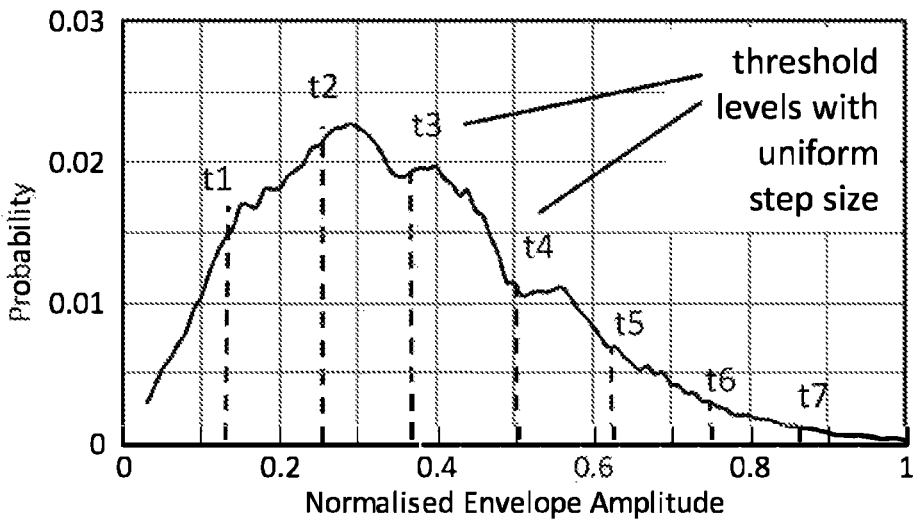
FIG. 4B shows the PDF the transmitted signal with threshold levels having uniform step size between them.

FIG. 4B shows the PDF of FIG. 4A with threshold levels t1, t2 . . . t7 overlaid. In this example, the threshold levels are equally spaced. The equal sized threshold levels may correspond to the three-amplifier DPA system with seven states shown in Table 1 above. The threshold levels represent the amplitude levels of the transmitted signal that require the DPA to operate in a certain state. For example, for a signal envelope amplitude greater that t1 but less or equal to t2, the DPA operates in state 1; for a signal envelope amplitude greater that t2 but less or equal to t3, the DPA operates in state 2; and so on until, for a signal envelope amplitude greater that t7, the DPA operates in state 7. The threshold levels may be understood to be switchover points between the operating states of the DPA.

Figure 4C:
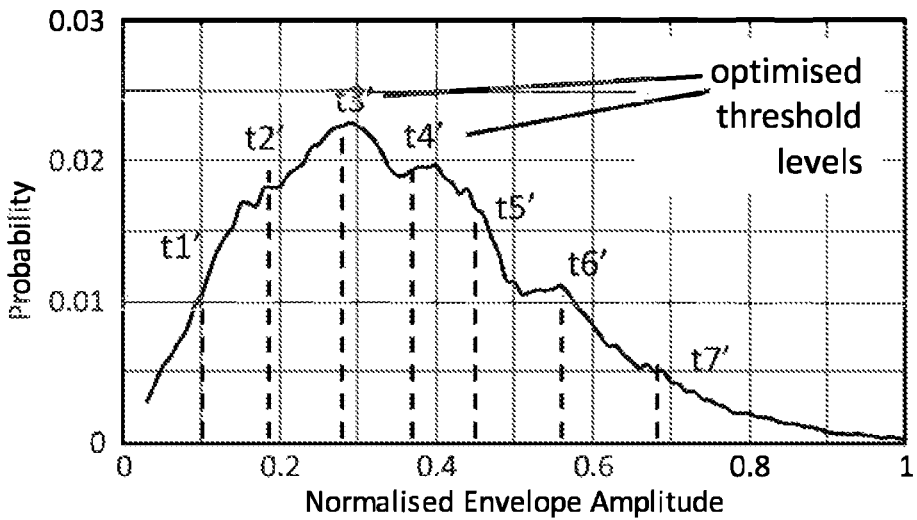
FIG. 4C shows the PDF the transmitted signal with optimised threshold levels in accordance with an embodiment.

FIG. 4C shows the PDF of FIG. 4A with optimised threshold levels t1', t2' . . . t7' overlaid. How the optimised threshold levels are obtained will be described further below. In this example, the optimised threshold levels have optimised step sizes between them. In this example, the optimised step sizes are non-uniform. Between envelope amplitudes of 0.1 and 0.6, six threshold levels t1', t2' . . . t6' (corresponding to five states of the DPA) are used. By contrast in FIG. 4B, for the same range of envelope amplitudes, four threshold levels t1, t2, t3, t4 (corresponding to four states of the DPA) are used. Therefore, in the optimised case, the DPA provides a more faithful transmission of the signal. In particular, by using optimised threshold levels, the DPA exhibits improved linearity. The linearity is quantified using a linearity metric. The linearity metric will be described further below in relation to FIGS. 5A and 5B.

The linearity of an amplifier is a measure of how faithfully it reproduces a signal without distorting it. Ideally, an amplifier faithfully replicates an input signal under all conditions. In practice, the replication of the signal depends on the signal power levels, number of bits, and operating loads amongst others. For a 3-bit DPA, the digital power amplifier generates a coarse output signal that can have one of seven possible values as illustrated in Table 1 or FIGS. 4B and 4C. The output of the digital power amplifier may be non-linear for some values of the input since the input is mapped onto one of the discrete output states. The linearity of an amplifier impacts an adjacent channel power ratio (ACPR) performance of the amplifier. The calculation of the ACPR is described further below.

The optimised threshold levels t1', t2' . . . t7' determine the $V_{out}$ and $P_{out}$ levels that are output from the DPA. From the determined Pout levels, the transmission line network, and/or the physical size of the devices, and/or the supply voltages of the amplifiers may be tuned using the procedure described above in relation to FIGS. 1, 2, and 3, and described in U.S. Non-Provisional patent application Ser. No. 16/176,684 which is incorporated herein by reference.

Figure 5A:
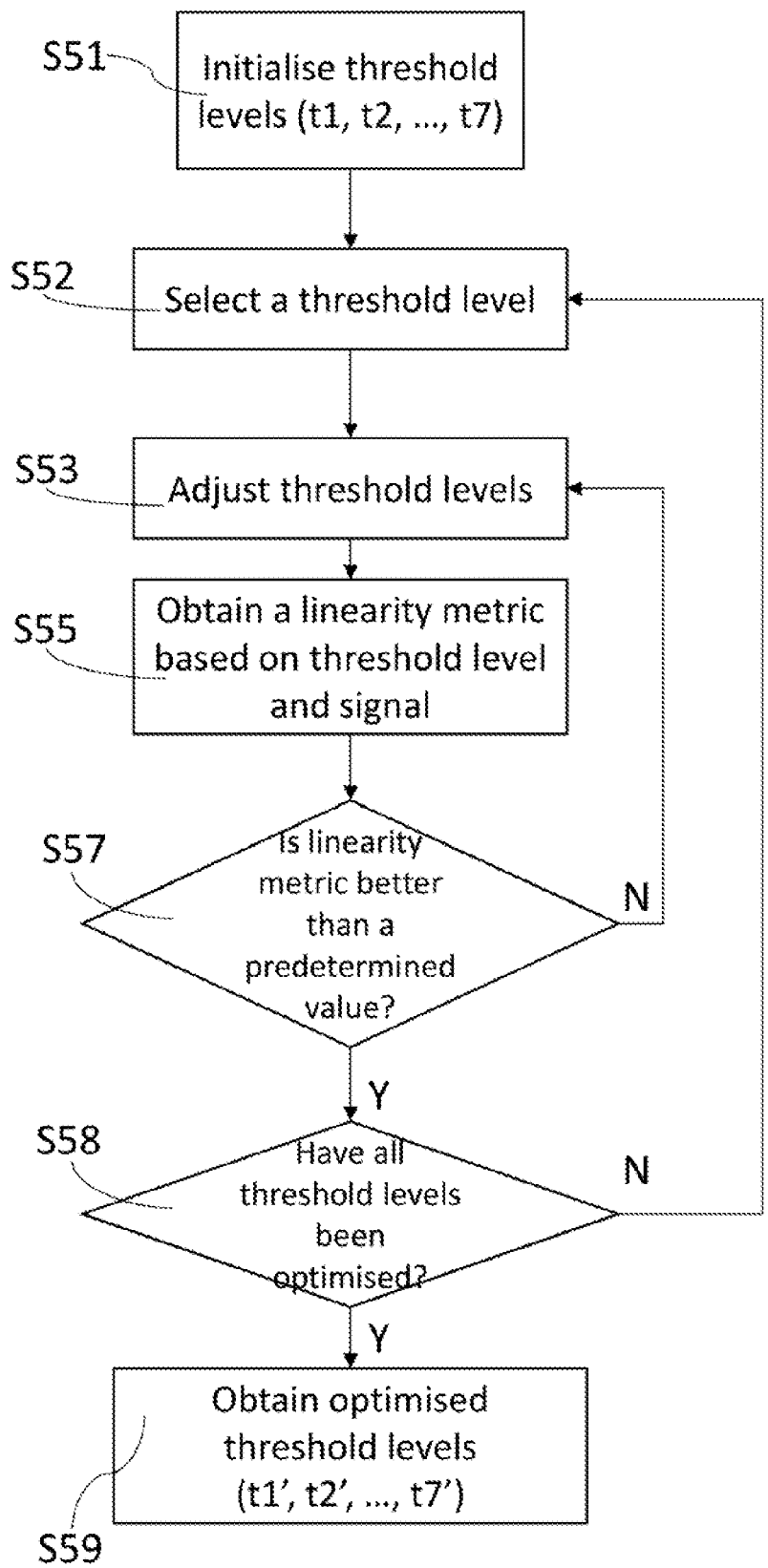
FIG. 5A shows a flow chart of a method of optimising a DPA in accordance with an embodiment.

FIG. 5A shows a flow chart of a method of iteratively obtaining threshold levels t1', t2', t3' . . . t7' for a DPA. In the method, the signal to be transmitted is considered and the threshold levels are selected to optimise the linearity when an input signal is amplified.

Optimising linearity means that the non-linearity is minimised or reduced. Optimising linearity also means that the linearity is improved as much as possible within the limits of the amplifier (e.g. number of bits, power supply, transistor load-pull characteristics, the signal, etc. . . . ). The linearity is quantified by a linearity metric, which is defined below. As will be described below, the lower the value of the linearity metric, the better the linearity of the amplifier. In the example of FIG. 5A, the method comprises the following steps.

In step S51, the threshold levels (t1, t2, . . . t7) are initialised. The initial levels may be set to have a uniform step size such as shown in FIG. 4B. Alternatively, the initial threshold levels may be randomised or may have any arbitrary value.

In step S52, each threshold level is selected in turn.

In step S53, the selected threshold level is adjusted from its initial value. For example, the threshold level is adjusted by adding an offset to the initial threshold level. It will be appreciated that, in a first pass through the offset or offsets applied may be zero or step S53 may be omitted altogether.

In step S55, a linearity metric is obtained. The linearity metric represents how faithfully the DPA amplifies the signal, based on the adjusted threshold levels. How the linearity metric is obtained will be described further below.

In Step S57, the linearity metric is compared to a predetermined value. If the linearity metric is worse that the predetermined value, the threshold levels are further adjusted. Alternatively, in step S57, a loop counter checks how many iterations have passed, and once a predetermined number of iterations have been exceeded, no further adjustments are performed.

In step S58, if all the threshold levels have been optimised, the method proceeds to S59, else if some threshold levels remain to be optimised, the method returns to S52 to select another threshold level.

It will be appreciated that S52 and S58 may be omitted in an alternative where all the threshold levels are adjusted together in one pass. For example, the thresholds are adjusted by adding an offset to each of the initial threshold levels in S53. The offset added to each threshold may be different.

In step S59, the optimised threshold levels are t1', t2', . . . t7' are obtained. The technical effect of the optimised threshold levels is described further below in relation to FIG. 8. An example of the optimised threshold levels t1', t2', . . . t7' shown in relation to the signal is shown in FIG. 4C. As shown in FIG. 4C. the step size between adjacent optimised threshold levels may be non-uniform. The step size between adjacent levels depends on the amplifiers and the signal, as will be described below.

The optimised threshold levels determine the Vout and Pout levels that are required from the DPA. From the Pout levels, the amplifiers and the output network may be tuned using the procedure described above in relation to FIGS. 1, 2 and 3 in order to implement those optimised threshold levels.

A measure of the linearity may be obtained from linearity metrics such as an adjacent channel power ratio (ACPR) or an error vector magnitude (EVM). Optionally, linearity metrics may be derived from a combination of metrics such as ACPR or EVM.

The ACPR may be understood as the power in an adjacent channel relative to the power in the signal channel. The adjacent channel refers to a channel adjacent to the signal channel. The bandwidth that the power is measured over is usually slightly smaller than the channel bandwidth. This is because the actual signal bandwidth is a little smaller than the channel bandwidth. For example, the signal bandwidth is about 10% smaller than the channel bandwidth.

Amplifiers such as those used in FIG. 1 have some degree of non-linearity in practice. When a switching signal is input to the amplifiers, some spectral re-growth may occur and power is leaked into the adjacent channel that can affect the performance of the DPA when used as a transmitter. Any non-linearity will be due to all of the amplifiers as they are turning on and off to recreate the signal. The lower the ACPR, the better the performance of the DPA.

In an example, the ACPR for a modulated signal is obtained as follows:

The signal is converted from I/Q cartesian format into polar form (gain and phase). The gain signal is a continuous (analogue) signal. The signal is an OFDM type signal for example.

The analogue gain signal is converted to a digitised gain signal. In the 3-bit amplifier DPA described, the gain is digitalised to 3-bit (i.e. seven output levels and one level where all amplifiers are off) and used to drive the bias inputs of the amplifiers. This means that the values of the gain signal are mapped to one of the seven output states of the DPA.

The digitised gain signal and the phase signal are converted back to I/Q format; the I/Q data is used to modulate an RF carrier, as illustrated in FIG. 11, in order to obtain an RF signal. The RF signal is then applied to the RF input of FIGS. 1, 2, and 3 for example.

Note that this may be done by physically inputting a signal into the DPA and measuring the response, or by using a simulator to simulate the response of a model of the DPA for that input signal. The response of the DPA is obtained.

The response may be a time domain signal such as that shown in FIG. 1 for example.

A power spectrum of the signal is obtained. The power spectrum is estimated using a Fast Fourier Transform (FFT) for example. The FFT may be a $2^{12}$ point FFT. This may be done by directly sampling the RF carrier. Alternatively, the signal may be down converted before sampling.

The power contained in the adjacent channel ($P_{adj}$) relative to the power in the signal channel ($P_{sig}$) is estimated. For example, the ACPR is obtained as $ACPR_{dB}=10 \log (P_{adj}/P_{sig})$. The ACPR may be averaged over a large number of samples.

The Error Vector Magnitude (EVM) is another measure of the performance of an amplifier. The EVM may be understood as the difference between an actual transmitted value and its ideal value. The difference is obtained as an error vector obtained from the I-Q plane. The lower the EVM, the better the performance of the DPA.

The EVM for the DPA is obtained in a similar manner as for the ACPR:

An RF input is applied to the DPA of FIG. 1, 2, or 3 as for the ACPR above.

The response of the DPA, which is the RF output, is down converted back to I/Q format.

The differences between the response signal on the I-Q plane (the output I/Q) and the ideal positions of the output states on the I-Q plane (the input I/Q) are obtained.

An average of the errors is obtained, using, for example, an arithmetic average or a mean square error to obtain an EVM. The EVM may be expressed as a percentage.

EVM may be expressed in dB as EVM [dB]=20 log (EVM [%]/100[%]).

Figure 5B:
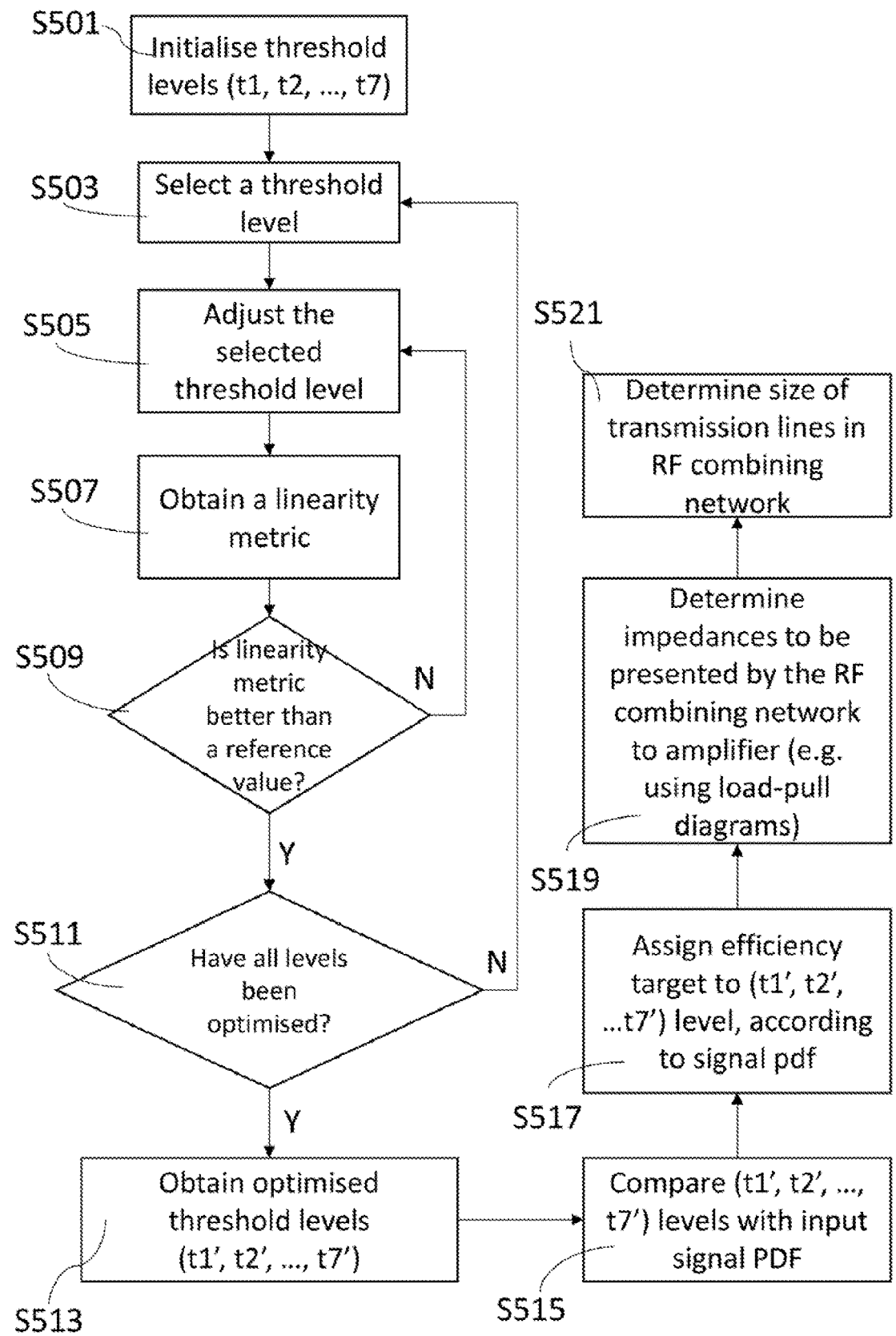
FIG. 5B shows a flow chart of a method of optimising a DPA in accordance with another embodiment.

FIG. 5B shows a flow chart of a method of optimising a DPA for a signal. Step S501 is similar to S51 above. In S503, a threshold level is selected so that each threshold is considered in turn.

In S505, each of threshold levels t1, t2 . . . t7 is adjusted in turn. In more detail, a threshold level, e.g. t1, is offset from its initial value. A linearity metric is then obtained in S507. The linearity metric may be obtained as described in relation to FIG. 5A). In S509, the obtained linearity metric is compared against a reference value. If the obtained value is better than the reference value, then the method proceeds to S505 and the next threshold level is optimised. If the S509 is negative, then the threshold level is further adjusted and S507 and S509 are performed again.

Once a threshold level has been adjusted, in S511, the method checks whether all threshold levels have been optimised and if not, S503 to S511 are repeated for the remaining threshold levels.

In S513, the optimised threshold levels are obtained. The technical effect of S513 is described further below in relation to FIG. 8.

In S515, the optimised threshold levels t1', t2' t7' are compared to the transmitted signal. In more detail, the optimised threshold levels are compared with the PDF of the signal, and, in S517, each threshold level is assigned an efficiency target that is scaled by the probability. This can be understood intuitively from FIG. 4C which shows optimised threshold levels overlaid with the signal PDF. Threshold levels that coincide with a higher probability (that is, with a higher chance of occurrence) are assigned a higher efficiency target than the threshold levels with a lower probability. For example, the threshold level corresponding to the peak probability (t3' in the example shown in FIG. 4C is assigned an efficiency target of 80%. The remaining threshold levels are scaled accordingly. The technical effect of S517 and S519 is described further below in relation to FIG. 9.

In S519, using the $P_{out}$s defined by the optimised threshold levels and the efficiency targets assigned in S517 and S519, the impedances presented by the RF combining network to the each amplifier is determined as described above in relation to FIGS. 1 to 3. From the determined impedances, the size of the transmission lines in the transmission line network is determined as described above in relation to FIGS. 1 to 3.

In the example of FIG. 5B steps S515 and S517 are optional steps. Alternatively, rather than comparing with the input signal, all threshold levels are assigned an efficiency target. For example, each threshold level is assigned an efficiency target of 70%. This requires that the individual amplifiers of the DPA can load-pull each other over the required impedance range. In the examples shown in FIGS. 2 and 3, an efficiency target of 40-50% is assigned to all threshold levels. Yet alternatively, steps S515 and S517 comprise using a genetic algorithm to determine the efficiency targets.

The examples of FIG. 5A and FIG. 5B comprise steps S51 to S59 and S501 to S513 respectively. Alternatively, these steps may be replaced by using a trained algorithm. For example, the trained algorithm would take the transmitted signal PDF as input and provide the optimised threshold levels as output. The algorithm may be trained using labelled data pairs comprising input signals and their corresponding optimised threshold levels.

Yet alternatively, the trained algorithm may be used to replace S51 and S501 of FIGS. 5A and 5B. The trained algorithm may provide initial threshold levels that are optimised for an input signal. The remaining steps of FIGS. 5A and 5B are unchanged. Since the methods starts with initial threshold values that are closer to the optimum, the method may converge more quickly.

Figure 6:
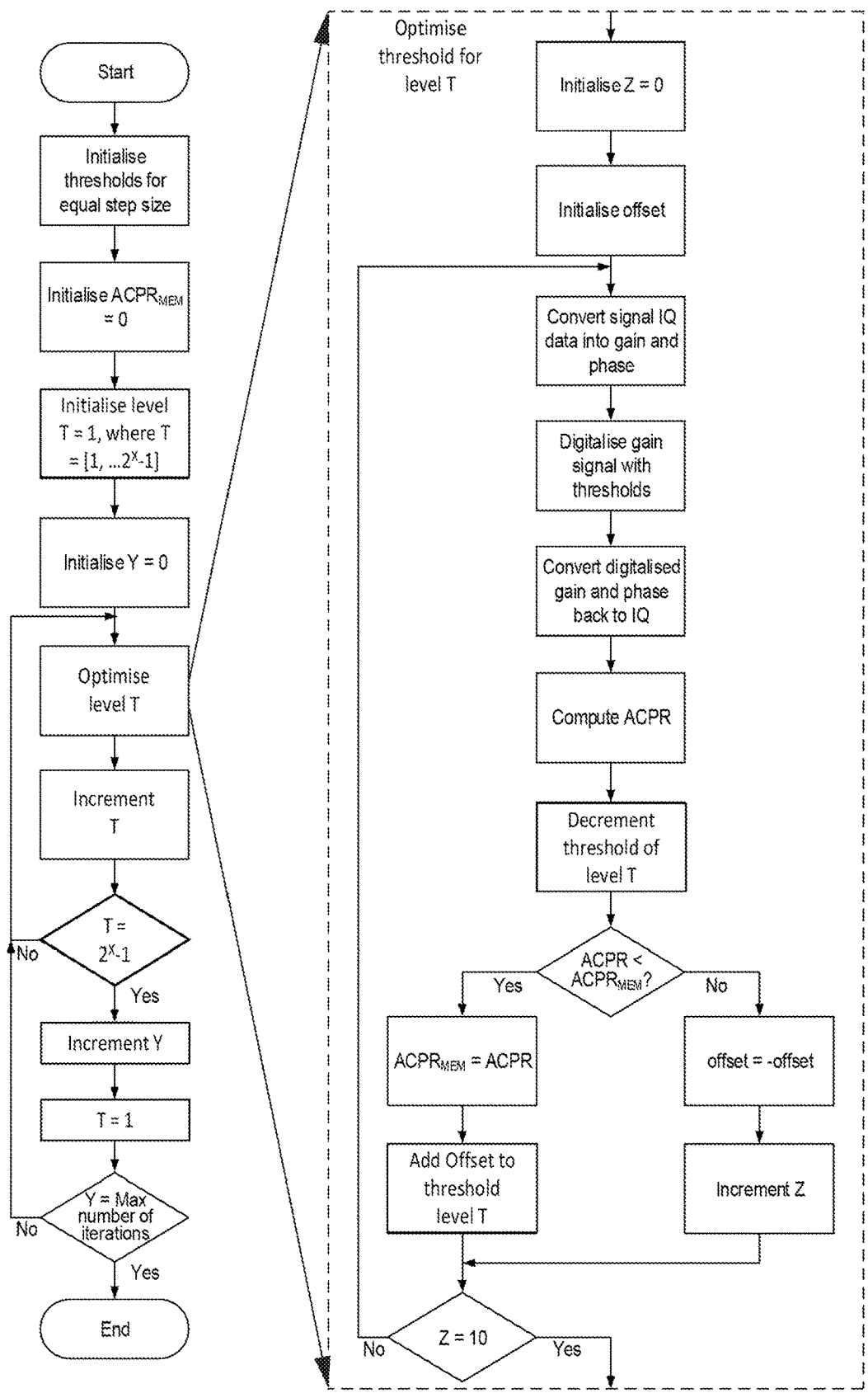
FIG. 6 shows a flow chart of a method of optimising a DPA in accordance with an embodiment.

FIG. 6 shows a flow chart of a method of obtaining threshold levels t1', t2', t3' . . . t7' for a DPA.

The threshold levels are initialised for equal step size. This means that irrespective of the signal, the threshold levels are assigned values so that for example, the voltage difference between adjacent states is uniform. An example is shown in Table 1 where the states have a uniform step size of 1V.

An initial value of ACPR, $ACPR_{MEM}$ is set to zero. $ACPR_{MEM}$ is stored in memory and used for comparison. The variable X represents the amplifier number. In the examples of FIGS. 1 to 3, X is equal to 3. The variable T represents the threshold levels that correspond to states where at least one of the amplifiers of the DPA is on. The value of T iterates through values of 1, 2, . . . $2^X-1$. An iteration number, Y, is initialised to zero. The iteration number represents how many times the threshold levels are optimised.

For each iteration (each value of Y), the threshold levels are optimised in turn. How the each threshold level T is optimised will be described below. After optimising threshold level T, T is incremented so that the algorithm considers the next level. If T=number of threshold levels $2^X-1$, then the iteration number Y is incremented and the value of T is re-initialised to T=1. If the updated iteration number Y equals a predefined limit (Y=max number of iterations), the method proceeds to an end, otherwise, the optimisation of the threshold levels starts again (without reinitialising $ACPR_{MEM}$ or the threshold levels).

The optimisation of each threshold level T is illustrated in the dashed box in FIG. 6 and is described next. The optimisation shown in the dashed box is applied to each threshold level in turn. For example, with X amplifiers, each of the $2^X-1$ threshold levels for which at least one of the amplifiers is on is optimised in turn. An iteration number Z is initialised to 0. Z determines up to how many times each threshold level is optimised. In this example, Z may have a value up to 10.

An offset is also initialised. The offset is added or subtracted from the value of a threshold level in order to adjust it. The offset has a value that is predetermined empirically.

Once the above are initialised, the method comprises the following steps:
(i) For a given set of threshold levels, the ACPR for the DPA is calculated. The ACPR is estimated as described in relation to FIGS. 5A and B for example. After obtaining the ACPR, the selected threshold level is decremented by the offset.
(ii) The calculated ACPR is then comparted to $ACPR_{MEM}$. $ACPR_{MEM}$ represents an acceptable level. On the first iteration of the algorithm, $ACPR_{MEM}$ is 0 (its initial value). If ACPR<$ACPR_{MEM}$, then the calculated value of ACPR overwrites the existing value of $ACPR_{MEM}$ ($ACPR_{MEM}$=ACPR). Thus, the value of the acceptable level $ACPR_{MEM}$ is updated as the algorithm iterates. The selected threshold level is then incremented by the offset value, and while Z<10, the algorithm starts again at (i). If Z=10, the algorithm breaks out of the loop.
(iii) If ACPR<$ACPR_{MEM}$ is not satisfied, then the value of the offset is overwritten by its negative (offset=-offset) and Z is incremented. While Z<10, the algorithm starts again at (i). The threshold is again decremented by the offset (which was previously overwritten by its negative); this has the effect of moving the threshold level in the opposite direction. If Z=10, the algorithm breaks out of the loop. It will be appreciated that the value of Z=10 is a non-limiting example. Other values of Z could also be used.

When Z=10 and the algorithm breaks out of the loop, the next threshold level may be considered.

Figure 7:
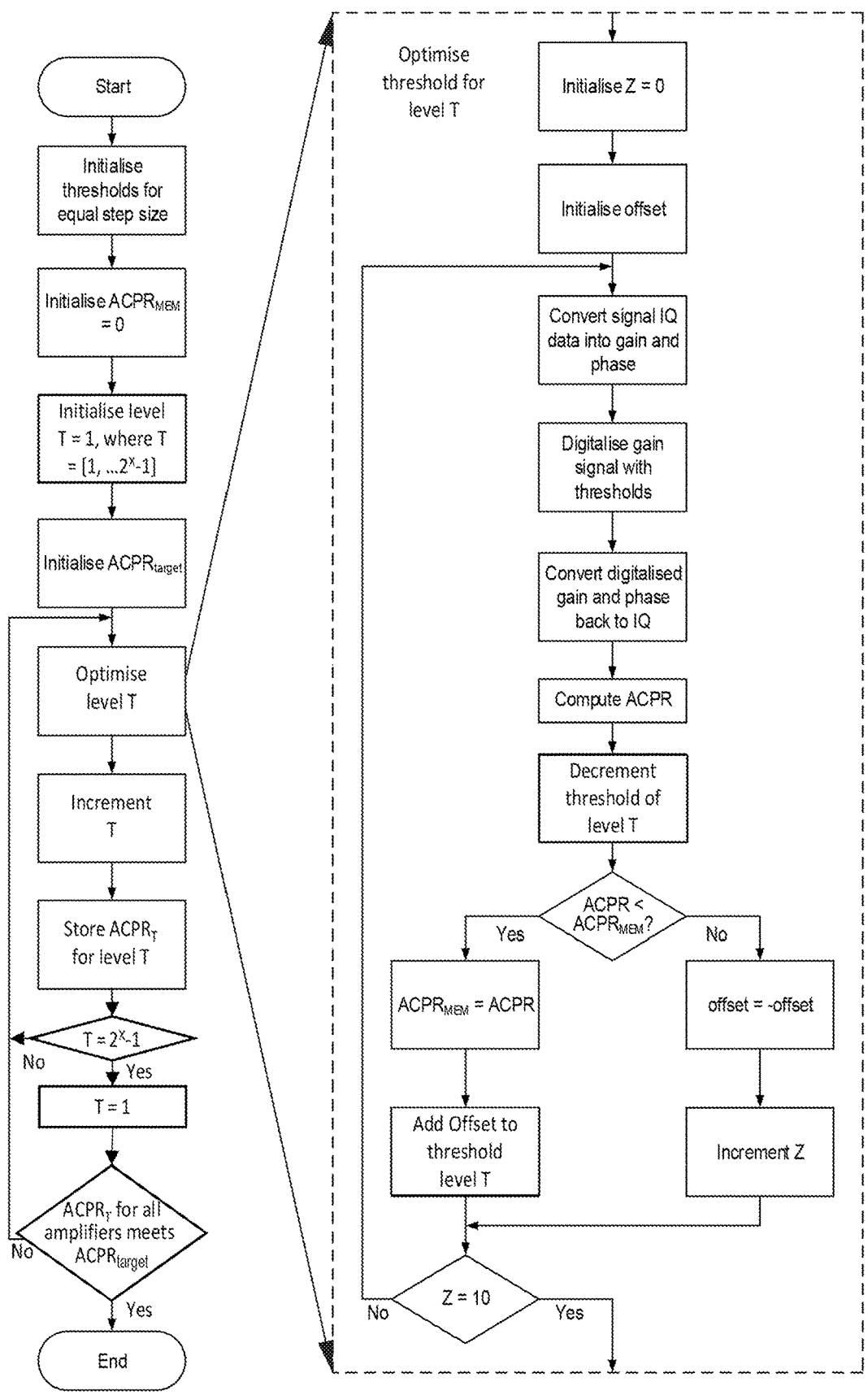
FIG. 7 shows a flow chart of a method of optimising a DPA in accordance with an embodiment.

FIG. 7 shows a schematic illustration of a method of obtaining threshold levels t1', t2', t3' . . . t7' for a DPA. The method is similar to that shown in FIG. 6. The method of FIG. 7 differs from that of FIG. 6 in the condition that is used to end the optimisation process. In the method of FIG. 6, the optimisation ends when an iteration number Y equals a predefined limit (Y=max number of iterations). In the method of FIG. 7, the optimisation ends when $ACPR_T$ (which represents the ACPR obtained after threshold level T has been optimised) for each of the $2^X-1$ threshold levels is less than or equal to a target ACPR, $ACPR_{MEM}$.

In yet another method, which is not shown, the conditions for ending the optimisation comprise the maximum number of iterations of FIG. 6, and the target ACPR ($ACPR_{MEM}$) of FIG. 7. Combining both end conditions ensure the algorithm does not loop on indefinitely.

Figure 8:
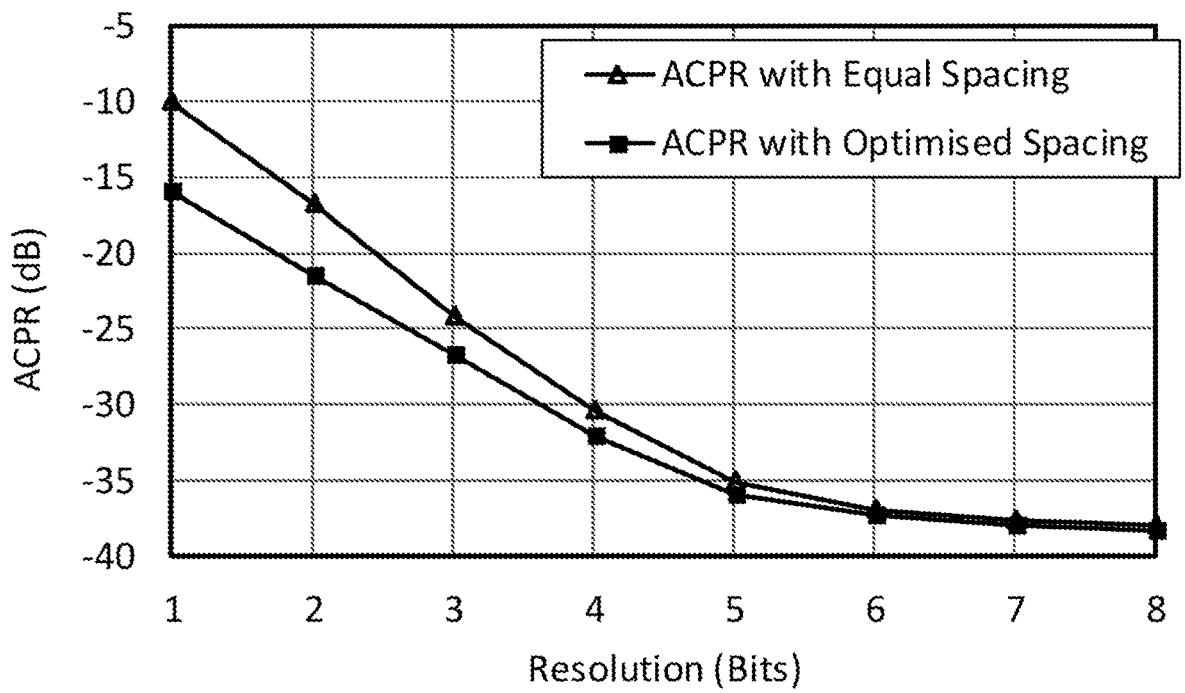
FIG. 8 shows a plot of the Adjacent Channel Power Ratio (ACPR) of the DPA with optimised threshold levels and with uniform step size spacing.

FIG. 8 shows the effect of using optimised threshold levels on the ACPR. FIG. 8 shows the variation of the ACPR for the entire DPA as a function of the resolution (bits). The ACPR value is averaged over a number of samples. The bits on the horizontal axis refer to the number of individual amplifiers. For the results labelled as ACPR with optimised spacing (■) the method of FIG. 7 was used to obtain the optimised threshold levels and optimised step size spacing. For the results labelled as ACPR with equal spacing (▲), no optimisation was applied and the threshold levels were assigned uniform step sizes. The improvement of ACPR with optimised spacing tails off partially due to limitations of the simulator (12-bit FFT) used for this process. Machine learning could be used to automate this process. Alternatively, the PDF shown in FIG. 4A may be used to make an initial estimate on the step-size. The algorithms in FIG. 6 and FIG. 7 start with equal step-size just as an example.

Figure 9:
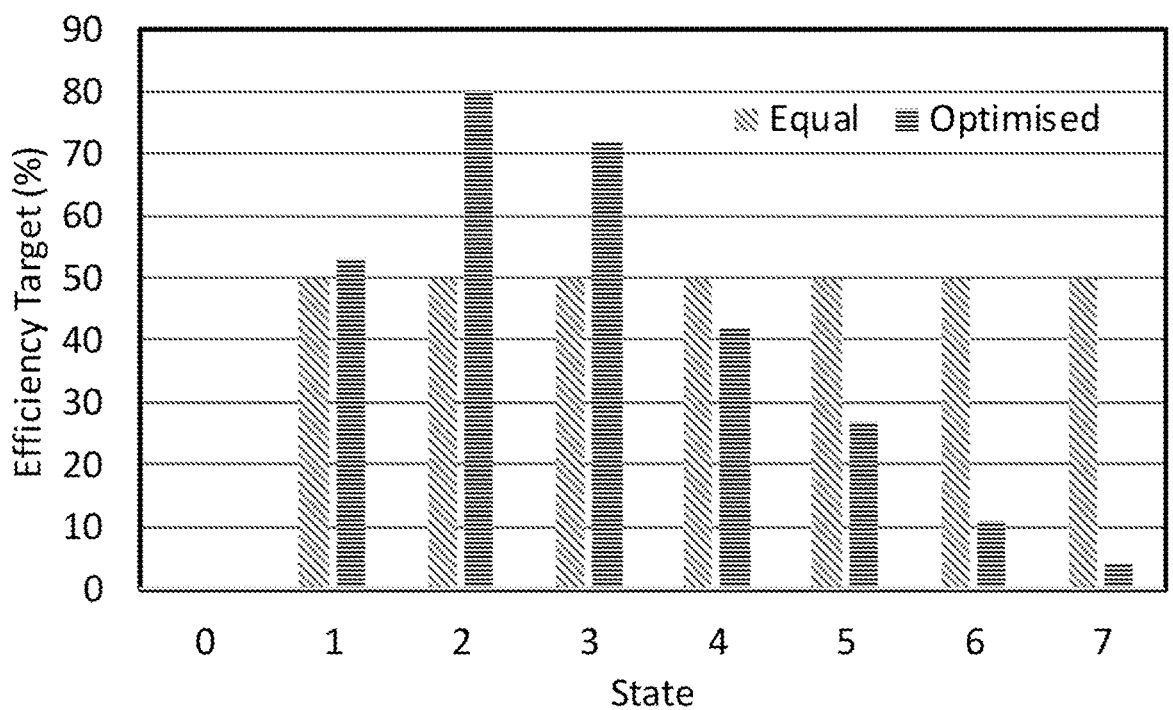
FIG. 9 shows an example of different efficiency targets being assigned to different states.

FIG. 9 shows an example of assigning different efficiency targets to each state. The examples concerns a 3-bit DPA. A larger efficiency target is assigned to state 2, which is the closest to the average value of the mean value of the PDF of the LTE signal shown in FIG. 4C. The values shown are purely for example only and will depend on many variables like the transistor devices, the circuit topology and the signal being amplified. However, improved performance can be achieved if a larger efficiency target weighting is applied to those values around the mean value.

FIG. 11 shows an example of a network for generating the digital input signals (D1, D2, D3) for use in embodiments. The biasing networks of the amplifiers shown in FIGS. 1 to 3 are connected to respective input nodes through which they receive input respective input signals $D_1$, $D_2$ and $D_3$. $D_1$, $D_2$ and $D_3$ are derived from a baseband input data as shown in FIG. 11. Baseband data in I and Q cartesian format is converted to polar (amplitude and phase). The amplitude information is decoded to provide the signals $D_1$, $D_2$ and $D_3$. The phase only signal is converted back to I and Q with a fixed amplitude to be converter to analogue signals with Digital-to-Analogue Converters (DAC). These are then upconverted to RF by mixers, a quadrature local oscillator and power combiner.

Embodiments presented herein differ from known analogue load modulating amplifiers in that the amplifiers of the DPAs of the embodiment experience load modulation whenever more than one amplifier is in operation. In Doherty amplifiers in contrast the peaking amplifier only load modulates the carrier amplifier in the region of the amplitude peaks. In Outphasing amplifiers both amplifiers experience an equal amount of load modulation at back-off.

Embodiments are specifically designed for a high $P_{OUT}$ using discrete devices (as opposed to low power CMOS integration), for applications like TV broadcast transmitters. Furthermore the embodiments describe above can be realised using transmission line architectures, implementing power amplifiers in this way lends itself well to high power implementations since losses are low and heat can be easily dissipated.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A digital power amplifier comprising:
a first amplifier;
a second amplifier; and
an output network,
wherein an output of the first amplifier and an output of the second amplifier are coupled to the output network, and
wherein at least one of the first and second amplifiers or the output network is configured such that at least three output levels are obtainable at an output of the output network, the output levels are iteratively adjusted to improve a linearity metric, and the output levels are adjusted for a predetermined number of iterations.

2. The digital power amplifier according to claim 1, wherein the output network includes one or more transmission lines.

3. The digital power amplifier according to claim 2 wherein the output network includes a rat-race combiner.

4. The digital power amplifier according to claim 2 wherein the output network includes a hybrid coupler.

5. The digital power amplifier according to claim 1, wherein the digital amplifier is operable at different efficiencies at an output level.

6. The digital power amplifier according to claim 5, wherein the efficiencies at the output level are determined from a probability density function of a signal.

7. The digital power amplifier according to claim 1, wherein the first and second amplifiers are operable in their saturation regions.

8. The digital power amplifier according to claim 7, wherein the first and second amplifiers are operable at different saturation powers.

9. The digital power amplifier according to claim 1, wherein the first amplifier includes a first transistor and the second amplifier includes a second transistor.

10. The digital power amplifier according to claim 9, wherein:
the first amplifier receives a first digital signal for activating or deactivating the first amplifier;
the second amplifier receives a second digital signal for activating or deactivating the second amplifier;
the first signal is applied as gate bias to the first transistor of the first amplifier; and
the second signal is applied as gate bias to the second transistor of the second amplifier.

11. A method for a digital power amplifier including a first amplifier, a second amplifier, and an output network, the method comprising:
iteratively adjusting at least three output levels to improve a linearity metric,
wherein an output of the first amplifier and an output of the second amplifier are coupled to the output network, and
wherein the output levels are adjusted for a predetermined number of iterations.

12. A digital power amplifier comprising:
a first amplifier;
a second amplifier; and
an output network including one or more transmission lines and a rat-race combiner,
wherein an output of the first amplifier and an output of the second amplifier are coupled to the output network, and
wherein at least one of the first and second amplifiers or the output network is configured such that at least three output levels are obtainable at an output of the output network.

13. The method according to claim 11, wherein the output levels are iteratively adjusted in turn.

14. The method according to claim 11, further comprising initializing the output levels, the initializing the output levels including setting the output levels so that they are equally spaced.

15. The method according to claim 11, wherein the linearity metric includes an adjacent channel power ratio (ACPR) and/or an error vector magnitude (EVM).

16. The method according to claim 11, wherein the output levels are adjusted until the linearity metric is less than a predetermined value.

17. A device comprising the digital power amplifier of claim 1, wherein the device is a mobile phone base station or a DVB transmitter.

18. The method according to claim 11, wherein the output levels are adjusted using a trained algorithm.

19. The method according to claim 11, further comprising:
assigning efficiency targets to the output levels based on a probability distribution function of a signal, and
configuring at least one of the first and second amplifiers or the output network such that the digital power amplifier is operable at the assigned efficiency targets,
wherein the efficiency targets are operation efficiencies of the digital power amplifier for the output levels.

* * * * *